(12) United States Patent
Yoshida et al.

(10) Patent No.: US 6,483,401 B2
(45) Date of Patent: Nov. 19, 2002

(54) SUBSTRATE FOR PACKAGING ELECTRONIC COMPONENT AND PIEZOELECTRIC RESONANCE COMPONENT USING THE SAME

(76) Inventors: Ryuhei Yoshida, c/o Murata Manufacturing Co., Ltd., 26-10, Tenjin 2-chome, Nagaokakyo-shi, Kyoto-fu (JP); Tsuneo Amano, c/o Murata Manufacturing Co., Ltd., 26-10, Tenjin 2-chome, Nagaokakyo-shi, Kyoto-fu (JP)

( * ) Notice: Subject to any disclaimer, the term of this patent is extended or adjusted under 35 U.S.C. 154(b) by 0 days.

(21) Appl. No.: 09/728,652

(22) Filed: Dec. 1, 2000

(65) Prior Publication Data

US 2001/0002807 A1 Jun. 7, 2001

(30) Foreign Application Priority Data

Dec. 2, 1999 (JP) .............................. 11-343277

(51) Int. Cl.⁷ ................................. H03H 9/15
(52) U.S. Cl. ....................... 333/187; 310/348
(58) Field of Search ................. 333/187, 189, 333/186, 188, 190, 191, 192; 310/348, 365

(56) References Cited

U.S. PATENT DOCUMENTS

| | | | | |
|---|---|---|---|---|
| 5,753,972 A | * | 5/1998 | Wein et al. ................... | 257/691 |
| 5,859,488 A | * | 1/1999 | Okeshi et al. ............... | 310/368 |
| 5,875,099 A | * | 2/1999 | Maesaka et al. ............ | 361/760 |
| 5,986,522 A | * | 11/1999 | Asakawa et al. ............ | 333/189 |
| 6,172,446 B1 | | 1/2001 | Kanayama et al. ......... | 310/348 |
| 6,320,384 B1 | * | 11/2001 | Doty et al. .................. | 324/321 |

FOREIGN PATENT DOCUMENTS

TW          85110335          10/1999

* cited by examiner

Primary Examiner—Robert Pascal
Assistant Examiner—Dean Takaoka
(74) Attorney, Agent, or Firm—Keating & Bennett, LLP

(57) ABSTRACT

A substrate of a case for packaging an electronic component includes a conductive cap bonded to a substrate to cover the electronic component and to tightly seal an enclosed space. The substrate has a substrate body layer, electrodes disposed on the substrate body layer, and a glass ceramic layer disposed on the substrate body layer so as to cover a portion of the electrodes.

16 Claims, 7 Drawing Sheets

SUBSTRATE FOR PACKAGING ELECTRONIC COMPONENT AND PIEZOELECTRIC RESONANCE COMPONENT USING THE SAME

BACKGROUND OF THE INVENTION

1. Field of the Invention

The present invention relates generally to substrates for mounting electronic components and more particularly to a substrate of a case for packaging chip-type electronic components. The present invention also relates to a piezoelectric resonance component including such a substrate.

2. Description of the Related Art

Conventionally, various chip-type piezoelectric resonance components including piezoelectric elements are known. Because the piezoelectric vibrating part in the piezoelectric resonator vibrates, the packaging of the piezoelectric resonator must be done in a manner that does not prevent or hinder the vibration.

FIG. 6 is an assembly view showing an example of a conventional chip-type piezoelectric resonance component.

This chip-type piezoelectric resonance component includes a substrate 51 made of an insulative ceramic such as alumina. On the upper surface of the substrate 51, electrodes 52 to 54 for achieving external electrical connection are provided. Also on the upper surface of the substrate 51, a rectangular-frame-shaped insulative glass layer 55 is disposed.

On the substrate 51, a capacitor 57 is bonded via a conductive adhesive 56. On the capacitor 57, a piezoelectric resonator 58, which vibrates in a thickness shear mode, is bonded by conductive adhesives (not shown).

A metal cap 59 is bonded on the upper surface of the substrate 51 by using an adhesive 60 so as to cover the layered structure including the capacitor 57 and the piezoelectric resonator 58.

The rectangular-frame-shaped insulative glass layer 55 prevents a short-circuit between the metal cap 59 and the electrodes 52 to 54.

FIG. 7 is an assembly view which shows another example of a conventional chip-type piezoelectric resonance component. This piezoelectric resonance component includes a substrate 61 having a dielectric body. The substrate 61 including the dielectric body has three capacitor electrodes, which constitute a three-terminal capacitor. Electrodes 62 and 63 are provided on the upper surface of the substrate 61 and an electrode 64 is disposed on the side surface of the substrate 61. The three-terminal capacitor is defined by the electrodes 62 to 64.

On the upper surface of the substrate 61, a piezoelectric resonator 66 which vibrates in a thickness shear mode is fixed by a conductive adhesive 65. A metal cap 67 is bonded on the upper surface of the base substrate 61 so as to cover the piezoelectric resonator 66. In this example, in order to reliably prevent a short-circuit between the metal cap 67 and the electrodes 62 and 63, an insulator 69 is applied to the metal cap 67 in advance. After hardening, the metal cap 67 is bonded to the substrate 61 via an insulative adhesive 68.

As is apparent from the above, when the substrates 51 and 61 are bonded to the metal caps 59 and 67, respectively, a very difficult and cumbersome process for securing the insulation between the metal cap 59 and the electrodes 52 to 54 provided on the substrate 51, and for securing the insulation between the metal cap 67 and the electrodes 62 and 63 provided on the substrate 61 must be included in the manufacturing process of the conventional piezoelectric resonance components.

With respect to the chip-type piezoelectric resonance component shown in FIG. 6, when the electrodes 52 to 54 are formed by applying and baking a conductive paste after the substrate 51 made of alumina is baked, the baking process is repeated in order to bake the conductive paste, and, furthermore, in order to form the insulative glass layer 55 on the top thereof, insulative glass must be applied thereon and baked again. Because of these extremely cumbersome steps, the cost of the conventional piezoelectric resonance components is very high.

As for the chip-type piezoelectric resonance component shown in FIG. 7, an insulative resin 69 is applied to the metal cap 67 in advance and is hardened thereon. However, since the metal cap 67 is normally formed by deep-drawing a metal plate, the flatness at the opening edge thereof is not satisfactory. Consequently, it becomes extremely difficult to apply the insulative resin 69 on the opening edge of the metal cap 67 in an even manner. It also becomes difficult to obtain a seal between the substrate 61 and the metal cap 67.

As is apparent from the above description, in the manufacture of the chip-type piezoelectric resonance components using metal caps, it is necessary to perform the steps of forming the insulative glass layer 55 on the substrate 51 and applying the insulative resin 69.

SUMMARY OF THE INVENTION

In order to overcome the problems described above, preferred embodiments of the present invention provide a substrate on which electric components are mounted and a chip-type piezoelectric resonance component including such a substrate.

The substrate according to preferred embodiments of the present invention provides a simplified structure for preventing a short-circuit between the metal cap and the electrodes on the substrate, facilitates attachment of the metal cap to the substrate, and greatly improves the sealing performance of the space enclosed by the substrate and the metal cap.

A substrate according to a preferred embodiment of the present invention includes a substrate body layer, a plurality of electrodes disposed on the substrate body layer, and a first glass-ceramic layer arranged so as to cover a portion of the electrode disposed on the substrate body layer.

Preferably, the substrate further includes a second glass-ceramic layer disposed on the lower surface of the substrate body layer.

The first and second glass ceramic layers may include one of anorthite-type crystallized glass, forsterite-type crystallized glass, celsian-type crystallized glass, a composite including a ceramic powder and one the above crystallized glasses, and a composite including a ceramic powder and non-crystallized glass.

A piezoelectric resonance component according to another preferred embodiment of the present invention includes the substrate of the above-described preferred embodiment of the present invention, a piezoelectric resonator mounted on the substrate, and a conductive cap bonded to the first glass ceramic layer of the substrate, so as to cover the piezoelectric resonator.

Preferably, the substrate body layer of the substrate includes a dielectric body and a plurality of capacitor electrodes arranged to define a capacitor in the substrate body layer.

Preferably, the first glass-ceramic layer disposed on the upper surface of the substrate has a substantially rectangular-frame shaped configuration.

Preferably, the piezoelectric resonance component is a piezoelectric oscillator.

Because the first glass ceramic layer is disposed on the substrate main body so as to cover a portion of the electrodes, when the substrate body layer includes a dielectric ceramic or an insulative ceramic, the substrate body layer and the glass ceramic layer can be baked at the same time, thus reducing the manufacturing cost of the substrate.

Furthermore, because the upper surface of the glass ceramic layer has excellent flatness, when the metal cap is bonded thereon, the space enclosed by the metal cap and the substrate is tightly sealed.

When the second glass ceramic layer is disposed on the lower surface of the substrate body layer, mechanical strength of the substrate is greatly improved by the second glass ceramic layer. Thus, the reliability of the electronic components using the substrates of various preferred embodiments of the present invention is greatly improved.

When anorthite-type crystallized glass or forsterite-type crystallized is used in the first or second glass layers or both, these crystallized glasses have lower thermal expansion coefficients compared to alumina. Thus, when the metal cap is bonded thereon, the thermal expansion coefficient difference between the metal cap and the substrate is small, and an electronic component having superior thermal stress properties can be obtained.

In the piezoelectric resonance component according to a preferred embodiment of the present invention, a piezoelectric resonator is mounted on the substrate, and the conductive cap is bonded to the glass ceramic layer of the substrate so as to cover the piezoelectric resonator. Thus, the conductive cap can be firmly bonded to the substrate by using an insulative adhesive or other suitable material, and the substrate, as described above, is manufactured at lower cost and has superior mechanical strength. The space enclosed by the substrate and the conductive cap can be tightly sealed, and a highly reliable piezoelectric resonance component can be obtained.

In the piezoelectric resonance component of preferred embodiments of the present invention, when the substrate body layer of the substrate is made of a dielectric body and at least a pair of capacitor electrodes for constituting a capacitor are disposed on the substrate body layer, the capacitor is included in the substrate body layer. Thus, a built-in capacitor type piezoelectric resonance component can be provided.

When the first glass ceramic layer provided on the upper surface of the substrate has a substantially rectangular-frame shaped configuration, by aligning and bonding the substantially rectangular-frame shaped first glass ceramic layer and the opening edge of the conductive cap, the piezoelectric resonator can be fixed in the space surrounded by the first glass ceramic layer. Thus, a piezoelectric resonance component having superior sealing effects can be obtained.

Other features, elements, characteristics and advantages of the present invention will become more apparent from the following detailed description of preferred embodiments with reference to the attached drawings.

DETAILED DESCRIPTION OF PREFERRED EMBODIMENTS

Now, preferred embodiments of the present invention are described with reference to the drawings.

Figure 1:
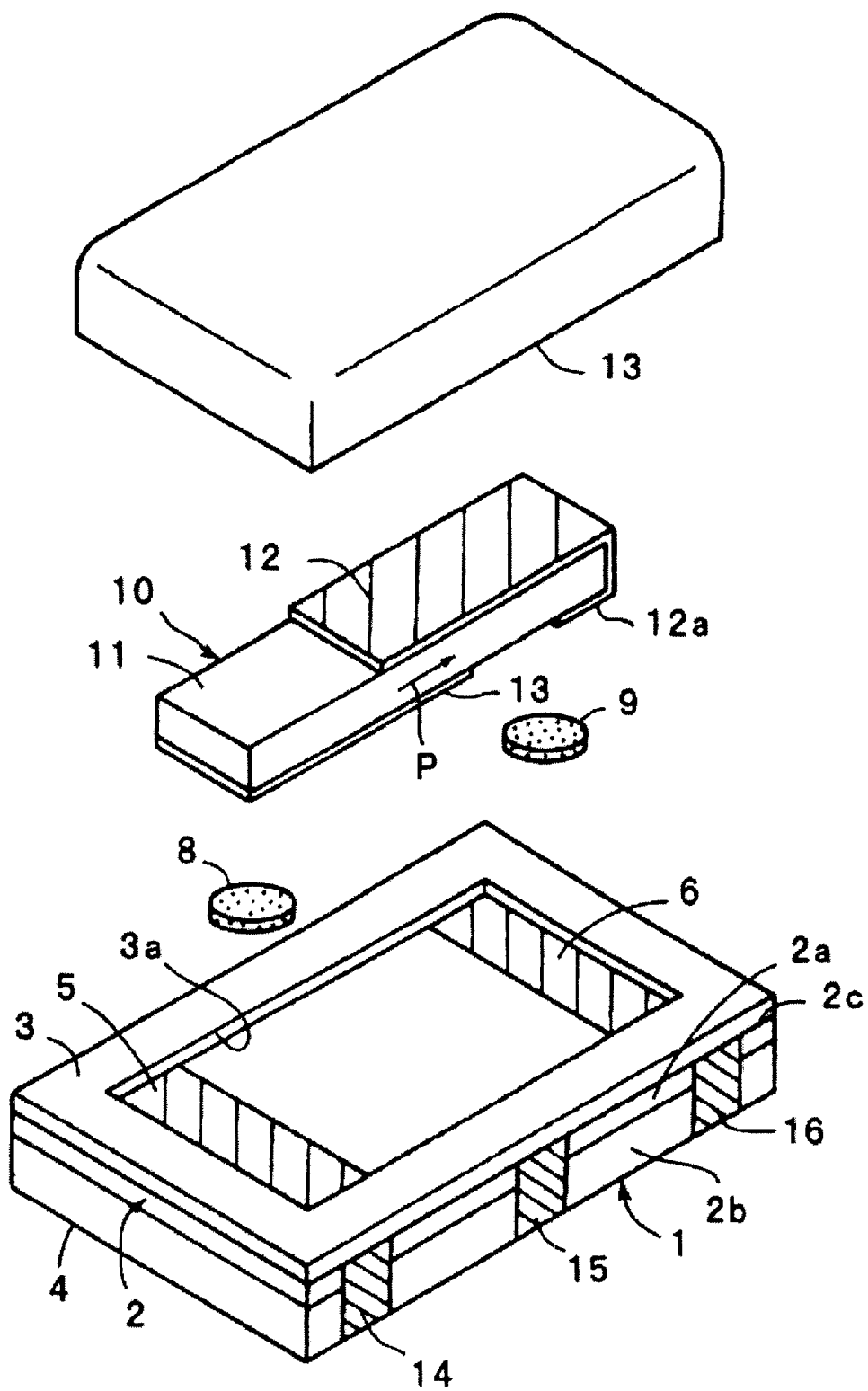
FIG. 1 is an assembly view of a chip-type piezoelectric resonance component according to the first preferred embodiment of the present invention.

FIG. 1 is an assembly view illustrating a chip-type piezoelectric resonance component according to a first preferred embodiment of the present invention.

Figure 2:
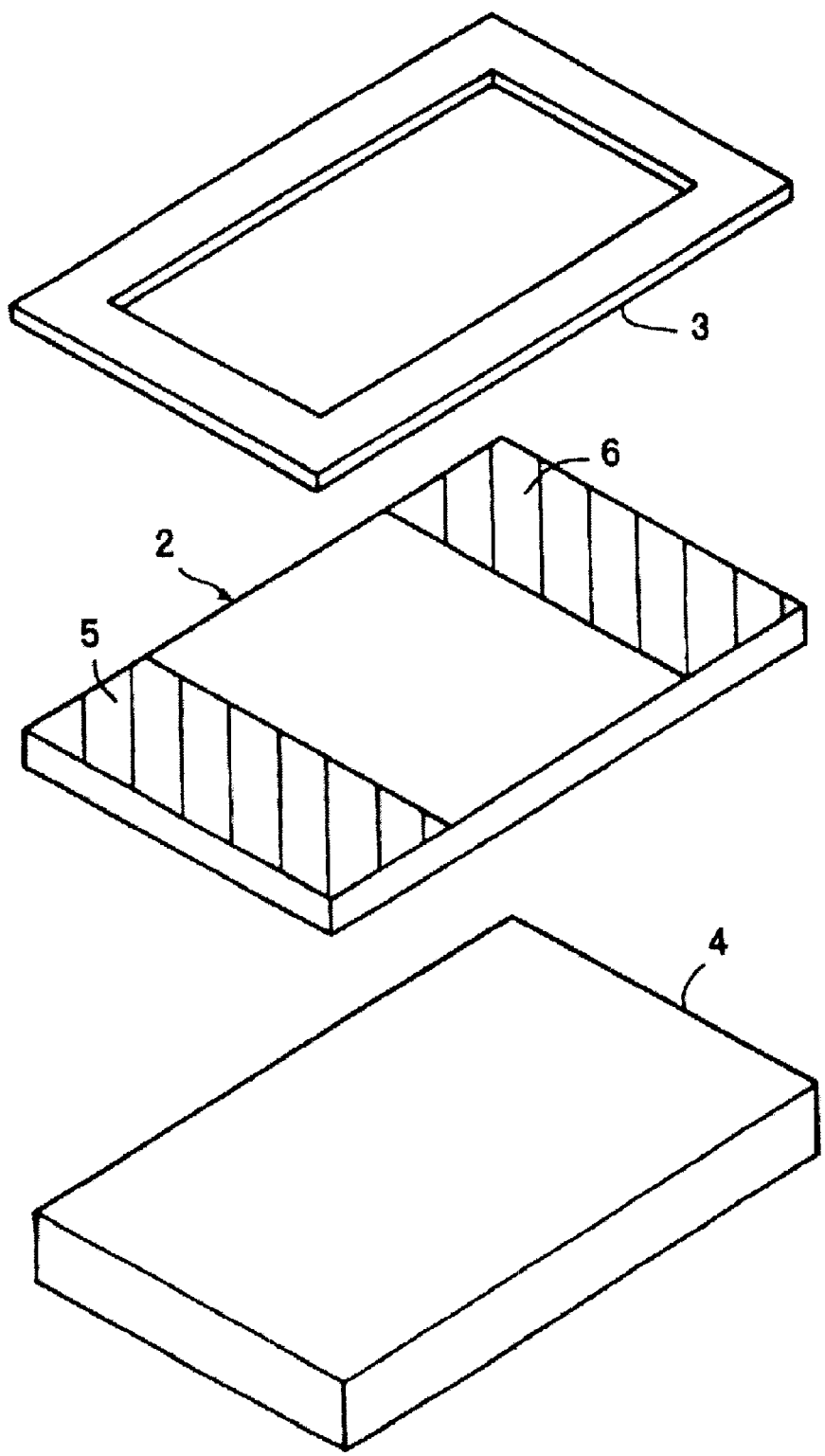
FIG. 2 is an assembly view of a substrate included in the preferred embodiment shown in FIG. 1.

The chip-type piezoelectric resonance component of this preferred embodiment uses a substrate 1 having a substantially rectangular shape. The substrate 1 is preferably made by laminating a first glass-ceramic layer 3 on the upper surface of a substrate body layer 2 and by laminating a second glass-ceramic layer 4 on the lower surface of the substrate body layer 2. An assembly view showing the substrate 1 is shown in FIG. 2.

The substrate body layer 2 is made of a dielectric ceramic such as a barium titanate ceramic. The substrate body layer 2 is preferably thinner than the second glass-ceramic layer 4.

Figure 3A:
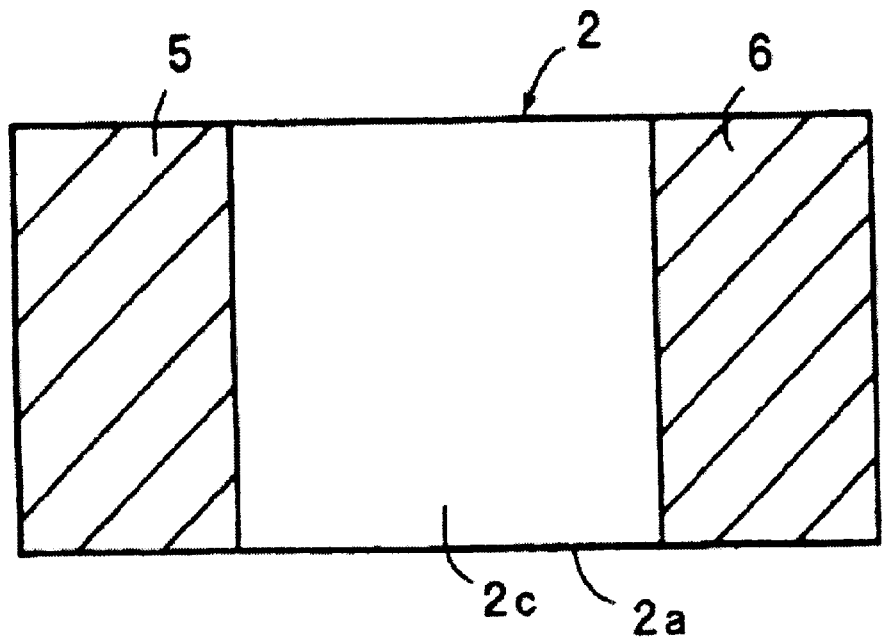
FIG. 3A is a plan view illustrating capacitor electrodes disposed on the upper surface of a substrate body layer.
Figure 3B:
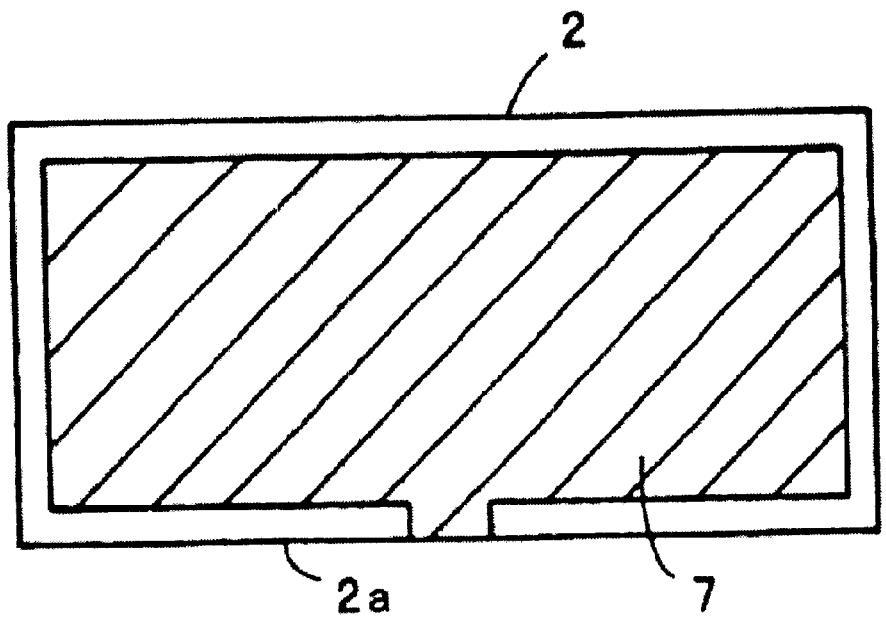
FIG. 3B is a bottom view illustrating a capacitor electrode disposed on the lower surface of the substrate body layer.

As shown in the plan view and the bottom view of FIGS. 3A and 3B, capacitor electrodes 5 and 6 are disposed on the upper surface of the substrate body layer 2. A capacitor electrode 7 is disposed on the lower surface of the substrate body layer 2. The capacitor electrodes 5 and 6 are aligned above the capacitor electrode 7 with a substrate body layer 2 therebetween, thus defining two capacitors.

The capacitor electrode 7 extends to the approximate middle portion of the edge at which a side 2a and a lower surface 2b of the substrate body layer 2 meet.

The capacitor electrodes 5 and 6 are arranged to extend across the width of an upper surface 2c of the substrate body layer 2 in the widthwise direction.

The first glass-ceramic layer 3 preferably has a substantially rectangular-frame shaped configuration and has a substantially rectangular opening 3a in the approximate center thereof. As shown in FIG. 1, when the glass-ceramic layer 3 is laminated on the substrate body layer 2, a portion of the capacitor electrodes 5 and 6 are covered by the glass-ceramic layer 3 and the remaining portion is exposed on the upper surface.

The second glass ceramic layer 4 preferably has a substantially rectangular-plate shaped configuration, and, as previously described, is preferably thicker than the substrate body layer 2.

The glass-ceramic layers 3 and 4 may include, for example, one of crystallized glass, a composite including ceramic powders and non-crystallized glass, and a composite including ceramic powders and crystallized glass. More particularly, anorthite-type crystallized glass, forsterite-type crystallized glass, cordierite-type crystallized glass, celsian-type crystallized glass, or other suitable material, may be used as the crystallized glass. In the composite including ceramic powder and non-crystallized glass, $SiO_2$—MgO—$Al_2O_3$-type, $SiO_2$—$Al_2O_3$-type, $SiO_2$—$Al_2O_3$—CaO-type, $SiO_2$—$Al_2O_3$—BaO-type, or $SiO_2$—CaO-type non-crystallized glass may be used as the non-crystallized glass, and $Al_2O_3$, $BaTiO_3$, $ZrO_2$, $TiO_2$ ceramic powder, or other suitable material, may be used as a ceramic powder.

The above-described glass-ceramic layers can be baked at a low temperature, for example, at a temperature of about 800° C. to 1000° C. Thus, the glass-ceramic layers and the dielectric ceramic which constitutes the substrate body layer 2 can be baked at the same time. Because the baking temperature is low, Ag can be used in the electrodes 5 to 7. In other words, inexpensive Ag can be used instead of expensive metals such as Pd and Ag—Pd.

Because the glass ceramic layers 3 and 4, and the dielectric ceramic can be baked at the same time, the substrate 1 can be manufactured by printing, on both sides of a compact body composed of an unbaked dielectric ceramic plate, an Ag paste in a shape corresponding to the shape of the electrodes 5 to 7, laminating the unbaked glass ceramic layers 3 and 4 so as to form layers, and baking the layered body at once. Thus, the substrate 1 can be easily obtained by using the layering and baking techniques.

In this preferred embodiment, the electrodes 5 and 6 may be plated with Ni or Au.

Referring back to FIG. 1, an energy trap-type piezoelectric resonator 10 to which a thickness shear mode is applied is fixed on the substrate 1 preferably by conductive adhesives 8 and 9.

The piezoelectric resonator 10 has a piezoelectric plate 11 preferably made of a piezoelectric ceramic which is polarized in the direction indicated by arrow P in FIG. 1, a resonance electrode 12 disposed on the upper surface of the piezoelectric plate 11, and a resonance electrode 13 disposed on the lower surface of the piezoelectric plate 11. The resonance electrode 12 is electrically connected to a connector electrode 12a formed on the lower surface of the piezoelectric plate 11.

The resonance electrode 13 and the connector electrode 12a are electrically connected to the capacitor electrodes 5 and 6 via the conductive adhesives 8 and 9, respectively.

The metal cap 18 as a conductive cap is bonded to the substrate 1 by using an insulative adhesive. The metal cap 18 has an opening which faces downward, and is constituted of a metal material such as aluminum. Since the metal cap 18 is normally formed by deep drawing, the metal cap 18 does not have sufficient flatness at the edge surface of the opening, i.e., at the edge surface which faces downward. It should be noted that the metal cap 18 may be made of a material in which the surface of an insulative material is coated by a conductive layer. Through the above-described steps, a built-in-capacitor type piezoelectric oscillator can be configured as a chip-type piezoelectric resonance component.

Since the glass ceramic layer 3 is made by the above-described baking process, the surface thereof is sufficiently flat. Consequently, the edge surface of the opening of the metal cap 18 can be securely bonded to the upper surface of the glass ceramic layer 3 by using an insulative adhesive, and the space enclosed by the metal cap 18 and the substrate 1 can be tightly sealed.

Bonding of the metal cap 18 to the glass ceramic layer 3 may be carried out by forming a metal layer on the surface of the glass ceramic layer 3, and seam welding the metal layer to the metal cap 18.

Since the glass ceramic layer 3 and the substrate body layer 2 in the chip-type piezoelectric resonance component of this preferred embodiment are baked at a low temperature, the manufacturing cost for the substrate 1 is greatly reduced. Also, because the metal cap 18 is bonded to the substantially rectangular-plate shaped glass ceramic layer 3, an inexpensive and thin metal cap can be used as the metal cap 18. Furthermore, the insulation process for applying insulative resins onto the metal cap 18 is no longer necessary.

When anorthite-type crystallized glass or forsterite-type crystallized glass is used in the glass ceramic layers 3 and 4, the thermal expansion coefficient thereof is approximately 4 ppm/° C. to about 5 ppm/° C., a value lower than that of alumina which is approximately 7 ppm/° C. Accordingly, the difference in the thermal expansion coefficients between the metal cap and the substrate is reduced, and thermal stress placed on the piezoelectric resonator is minimized. The characteristics of the piezoelectric resonance components become less variable, and the reliability thereof is greatly improved.

It is to be noted that in the substrate 1 of the first preferred embodiment, the second glass ceramic layer 4 may include a substrate material, such as an alumina powder, which acts as a constraining layer that constrains the substrate body layer from contraction in the horizontal direction during baking.

On the side surface of the substrate 1, external electrodes 14 to 16 are provided. The external electrodes 14 and 16 are electrically connected to the capacitor electrodes 5 and 6, respectively, and the external electrode 15 is electrically connected to the capacitor electrode 7.

Figure 4:
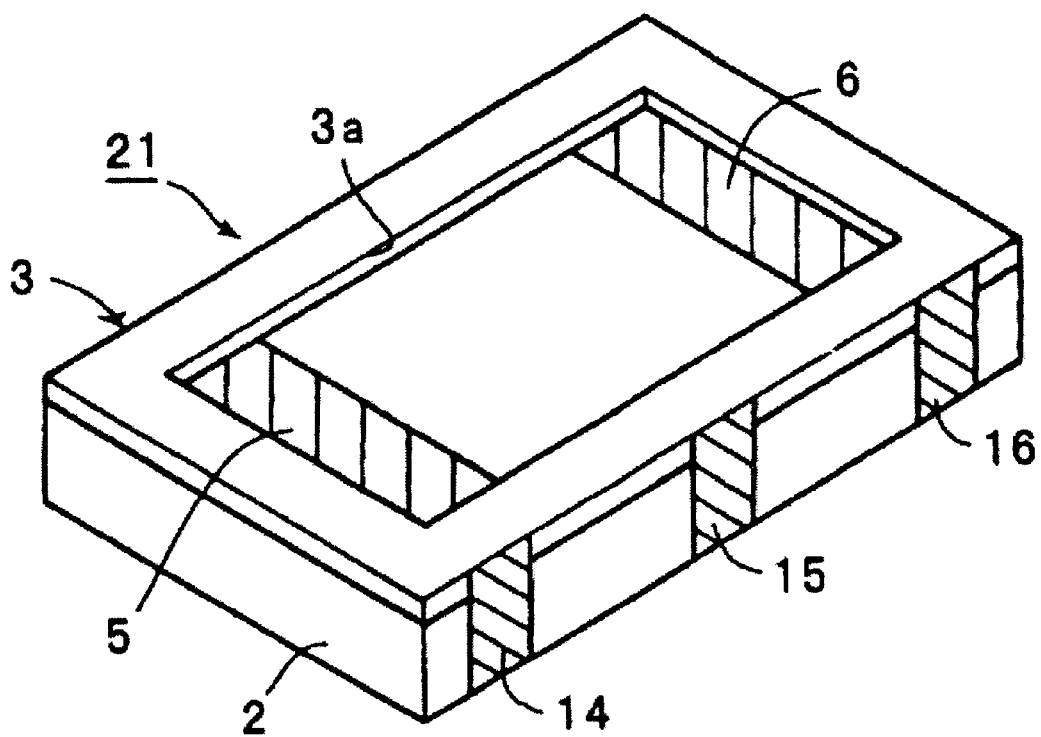
FIG. 4 is a perspective view of a substrate according to a second preferred embodiment of the present invention.
Figure 5:
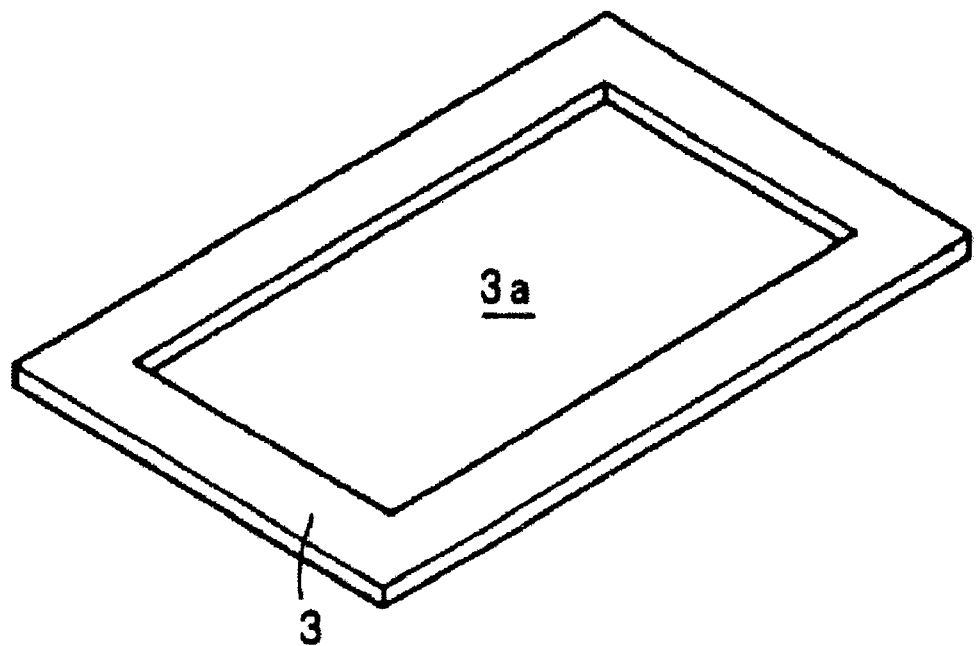
FIG. 5 is an assembly view of the substrate included in the second preferred embodiment shown in FIG. 4.
Figure 5:
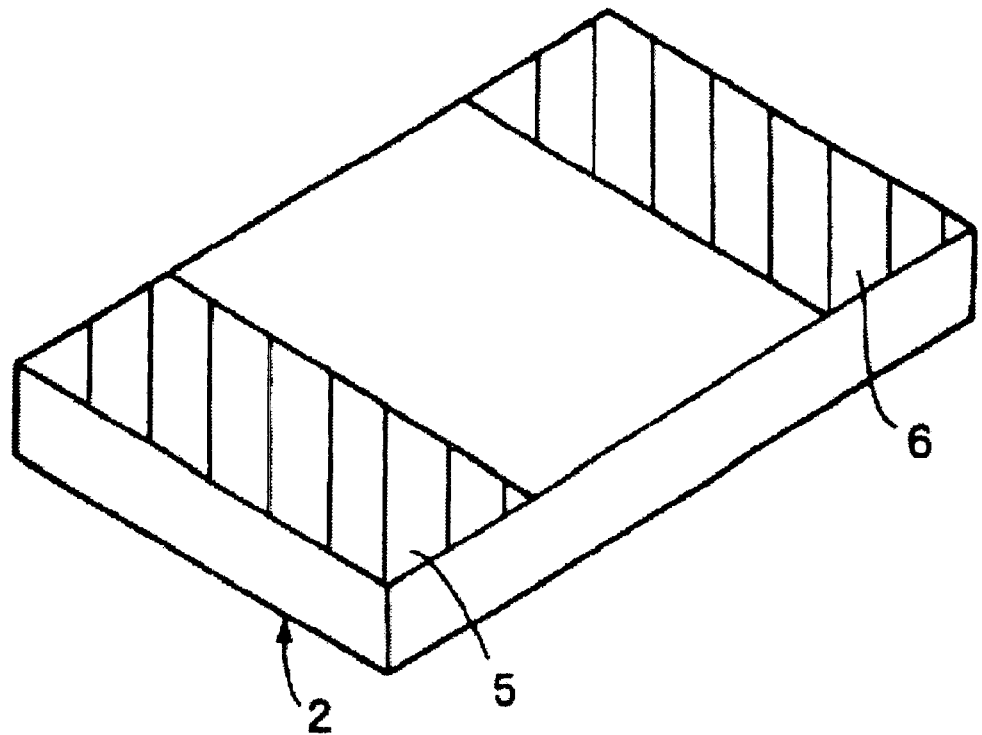
Figure 6:
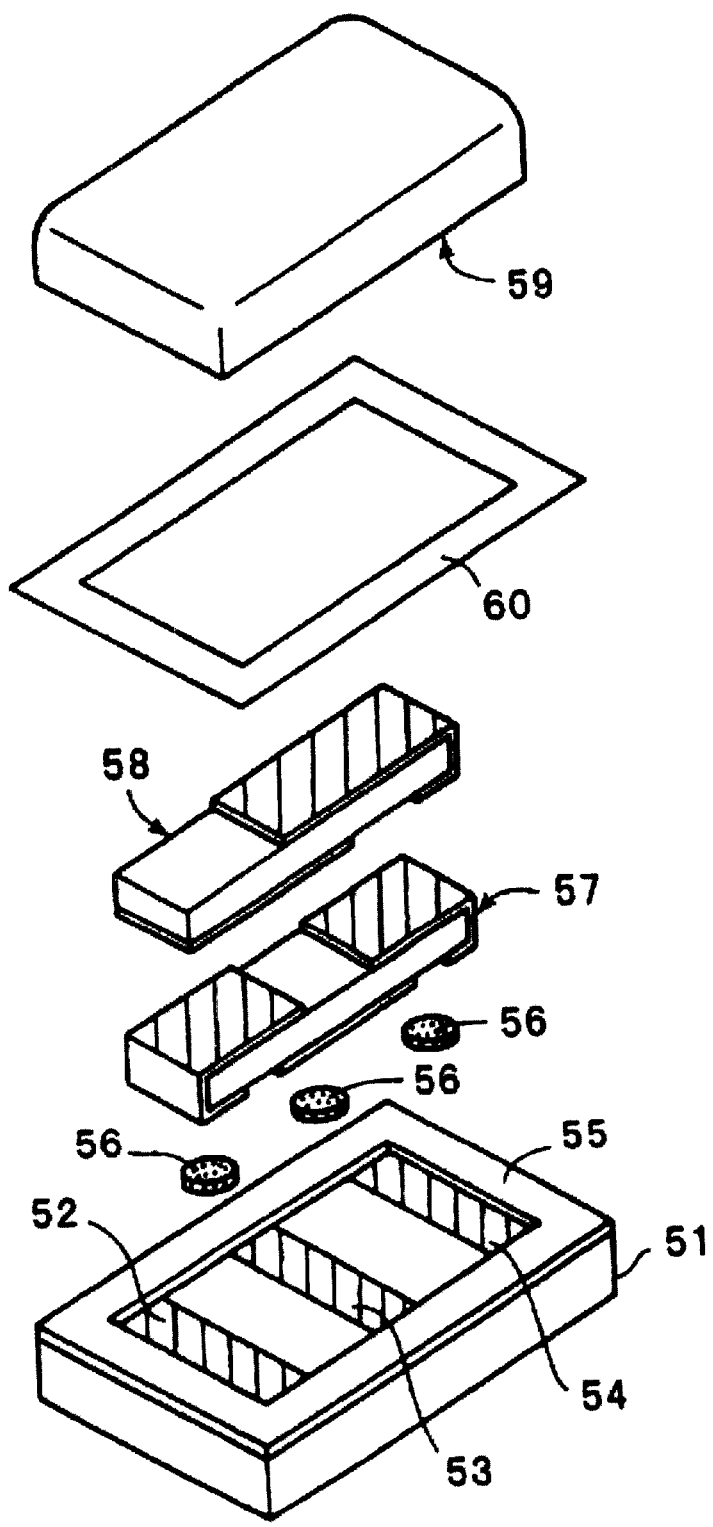
FIG. 6 is an assembly view illustrating an example of a conventional chip-type piezoelectric resonance component.
Figure 7:
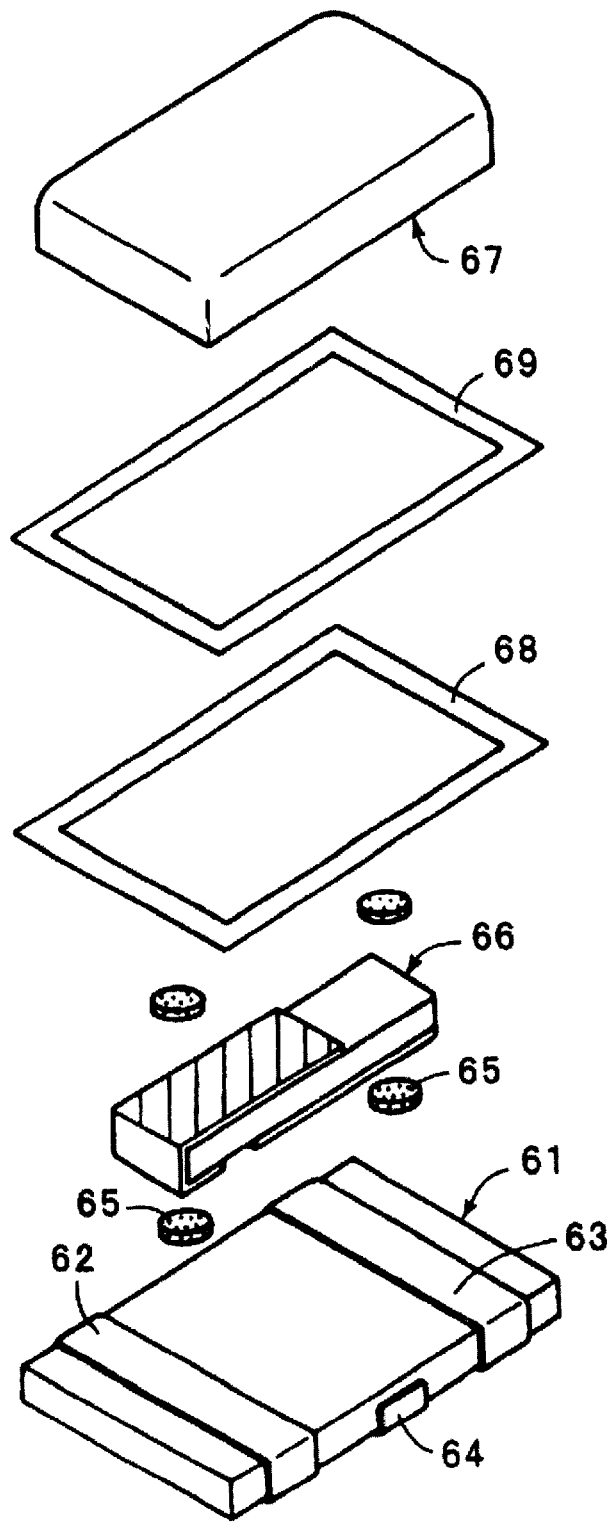
FIG. 7 is an assembly view illustrating another example of a conventional chip-type piezoelectric resonance component.

FIG. 4 is a perspective view showing a substrate included in a second preferred embodiment of the present invention. The substrate 21 is preferably similar to the substrate 1 shown in FIG. 1 except that the substrate 21 does not have a second glass ceramic layer on the lower surface thereof. The substrate 21 has a substrate body layer 2 and a glass ceramic layer 3 layered on the upper surface of the substrate body layer 2. Because a second glass ceramic layer is not used, the substrate body layer 2 made of a dielectric ceramic is thicker.

Even when the substrate 21 of the second embodiment preferred is used, the glass ceramic layer 3 and the substrate body layer 2 can be baked simultaneously as in the first preferred embodiment, and the cost for manufacturing the substrate 21 is greatly reduced. Since the upper surface of the glass ceramic layer 3 has sufficient flatness, the metal cap can be securely bonded to the upper surface of the glass ceramic layer 3 by using an insulative adhesive, and the enclosed space is provided with a superior sealing effect.

Furthermore, because external electrodes 14 to 16 are disposed on the side of the substrate body layer 2, the substrate 21 can be mounted on the surface of a printed circuit board.

It should be noted that although the each of the above-described preferred embodiments has the substrate body layer 2 that is preferably made of a dielectric ceramic and a capacitor including the capacitor electrodes 5 to 7, there is no particular need for forming the capacitor on the substrate body layer 2 in the chip-type piezoelectric resonance component of the present invention. When the capacitor is not provided, an insulative ceramic having low dielectric constant, instead of a dielectric ceramic, may be included in the substrate body layer 2.

However, by using the substrates of the first and second preferred embodiments, that is, substrates which have a built-in capacitor, a built-in load-capacitance-type piezoelectric oscillator including a piezoelectric resonator and a capacitor electrically connected to the piezoelectric resonator can be provided as a single-chip-type piezoelectric resonance component.

While the invention has been described with reference to preferred embodiments thereof, many modifications and variations of the present invention are possible in light of the above teachings. It is therefore to be understood that within the scope of the appended claims, the invention may be practiced otherwise than as specifically described.

What is claimed is:

1. A substrate for packaging an electronic component, comprising:
   a substrate body layer;
   a plurality of electrodes disposed on the substrate body layer; and
   a first glass ceramic layer arranged to cover a portion of the electrode provided on the substrate body layer;
   capacitor electrodes disposed on the upper surface of the substrate body layer; and
   a capacitor electrode disposed on the lower surface of the substrate body layer.

2. A substrate according to claim 1, wherein the substrate body layer is made of a dielectric ceramic.

3. A substrate according to claim 1, wherein the capacitor electrodes disposed on the upper surface of the substrate body layer are aligned above the capacitor electrode disposed on the lower surface of the substrate body layer so as to define two capacitors.

4. A substrate according to claim 1, wherein the capacitor electrodes disposed on the upper surface of the substrate body layer are arranged to extend across the width of an upper surface of the substrate body layer in the widthwise direction.

5. A substrate according to claim 1, wherein the first glass ceramic layer comprises one of anorthite-type crystallized glass, forsterite-type crystallized glass, cordierite-type crystallized glass, or celsian-type crystallized glass, a composite including a ceramic powder and one of the following glasses: anorthite-type crystallized glass, forsterite-type crystallized glass, cordierite-type crystallized glass, or celsian-type crystallized glass, or a composite including a ceramic powder and non-crystallized glass.

6. A substrate according to claim 1, further coprising a second glass ceramic layer disposed on the lower surface of the substrate body layer.

7. A substrate according to claim 6, wherein the substrate body layer is thinner than the second glass-ceramic layer.

8. A substrate according to claim 6, wherein the second glass ceramic layer comprises one of anorthite-type crystallized glass, forsterite-type crystallized glass, cordierite-type crystallized glass, or celsian-type crystallized glass, a composite including a ceramic powder and one of the following glasses: anorthite-type crystallized glass, forsterite-type crystallized glass, cordierite-type crystallized glass, or celsian-type crystallized glass, or a composite including a ceramic powder and non-crystallized glass.

9. A substrate according to claim 8, wherein the second glass ceramic layer further comprises an alumina powder.

10. A piezoelectric resonance component comprising:
    a substrate including:
      a substrate body layer;
      a plurality of electrodes disposed on the substrate body layer;
      a first glass ceramic layer arranged to cover a portion of the electrode provided on the substrate body layer; and
      a second glass ceramic layer disposed on the lower surface of the substrate body layer;
    a piezoelectric resonator mounted on the substrate; and
    a conductive cap which is bonded to the first glass ceramic layer of the substrate so as to surround the piezoelectric resonator.

11. A piezoelectric resonance component according to claim 10, wherein the first glass ceramic layer comprises one of anorthite-type crystallized glass, forsterite-type crystallized glass, cordierite-type crystallized glass, or celsian-type crystallized glass, a composite including a ceramic powder and one of the following glasses: anorthite-type crystallized glass, forsterite-type crystallized glass, cordierite-type crystallized glass, or celsian-type crystallized glass, or a composite including a ceramic powder and non-crystallized glass.

12. A piezoelectric resonance component according to claim 10, wherein the second glass ceramic layer comprises one of anorthite-type crystallized glass, forsterite-type crystallized glass, cordierite-type crystallized glass, or celsian-type crystallized glass, a composite including a ceramic powder and one of the following glasses: anorthite-type crystallized glass, forsterite-type crystallized glass, cordierite-type crystallized glass, or celsian-type crystallized glass, or a composite including a ceramic powder and non-crystallized glass.

13. A piezoelectric resonance component according to claim 12, wherein the second glass ceramic layer further comprises an alumina powder.

14. A piezoelectric resonance component according to claim 13, wherein the substrate body layer comprises a dielectric body, and the plurality of electrodes disposed on the substrate body layer constitutes a capacitor.

15. A piezoelectric resonance component according to claim 13, wherein the first glass ceramic layer has a substantially rectangular-frame shaped configuration.

16. A piezoelectric resonance component according to claim 13, wherein the piezoelectric resonance component is a piezoelectric oscillator.

* * * * *